US012637759B2

(12) United States Patent
Moradian et al.

(10) Patent No.: US 12,637,759 B2
(45) Date of Patent: May 26, 2026

(54) MODEL-BASED PURGE GAS FLOW

(71) Applicant: Applied Materials, Inc., Santa Clara, CA (US)

(72) Inventors: Ala Moradian, Sunnyvale, CA (US); Vishwas Kumar Pandey, Madhya Pradesh (IN); Lori D. Washington, San Jose, CA (US); Miao-Chun Chen, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 137 days.

(21) Appl. No.: 17/568,404

(22) Filed: Jan. 4, 2022

(65) Prior Publication Data

US 2023/0212742 A1 Jul. 6, 2023

(51) Int. Cl.
    *C23C 16/24* (2006.01)
    *C23C 16/52* (2006.01)

(52) U.S. Cl.
    CPC .............. *C23C 16/24* (2013.01); *C23C 16/52* (2013.01)

(58) Field of Classification Search
    CPC ..... C23C 16/24; C23C 16/52; C23C 16/4585; C23C 16/4408
    See application file for complete search history.

(56) References Cited

U.S. PATENT DOCUMENTS

| | | | | |
|---|---|---|---|---|
| 5,326,725 A | * | 7/1994 | Sherstinsky | .......... C23C 16/042 |
| | | | | 118/503 |
| 6,045,862 A | * | 4/2000 | Mizukami | ........... C23C 16/4585 |
| | | | | 427/248.1 |

| | | | |
|---|---|---|---|
| 7,456,429 B2 | 11/2008 | Levy | |
| 7,459,175 B2 | 12/2008 | Kaushal et al. | |
| 7,838,072 B2 | 11/2010 | Kaushal et al. | |

(Continued)

FOREIGN PATENT DOCUMENTS

| | | |
|---|---|---|
| JP | 2008529276 A | 7/2008 |
| JP | 2008529277 A | 7/2008 |

(Continued)

OTHER PUBLICATIONS

International Search Report and Written Opinion for International Application No. PCT/US2022/036969 dated Nov. 11, 2022, 11 pages.

(Continued)

*Primary Examiner* — Dah-Wei D. Yuan
*Assistant Examiner* — Nga Leung V Law
(74) *Attorney, Agent, or Firm* — Patterson + Sheridan, LLP

(57) ABSTRACT

Embodiments herein provide for a method of processing a semiconductor substrate. The method described herein may include receiving a first input corresponding to a first geometric hardware configuration of a process chamber, receiving a second input corresponding to a first process recipe of the process chamber, determining, based on the first input and the second input, a first purge gas flow rate for the process chamber, measuring a deposition characteristic of the process chamber via a first sensor, determining, based on the first input, the second input, and the measured deposition characteristic, a second purge gas flow rate, the second purge gas flow rate different from the first purge gas flow rate, and flowing a purge gas at the second purge gas flow rate during a deposition process.

20 Claims, 12 Drawing Sheets

(56)             References Cited

U.S. PATENT DOCUMENTS

| | | | |
|---|---|---|---|
| 9,870,919 | B2 | 1/2018 | Ranish et al. |
| 10,269,603 | B2 | 4/2019 | Nakagawa et al. |
| 10,640,883 | B2 | 5/2020 | Sakamoto et al. |
| 2006/0165890 | A1* | 7/2006 | Kaushal .................. C23C 16/52 |
| | | | 427/248.1 |
| 2006/0166501 | A1 | 7/2006 | Kaushal et al. |
| 2007/0228470 | A1 | 10/2007 | Levy |
| 2008/0092812 | A1* | 4/2008 | McDiarmid ...... H01L 21/67017 |
| | | | 118/724 |
| 2008/0241382 | A1* | 10/2008 | Clark ................ C23C 16/45527 |
| | | | 427/255.28 |
| 2012/0174859 | A1 | 7/2012 | Sakamoto et al. |
| 2016/0362813 | A1* | 12/2016 | Bao ................... H01L 21/02293 |
| 2019/0112709 | A1 | 4/2019 | Arkles et al. |
| 2020/0080202 | A1 | 3/2020 | Akashi et al. |

FOREIGN PATENT DOCUMENTS

| | | |
|---|---|---|
| TW | 200632132 A | 9/2006 |
| TW | 200808998 A | 2/2008 |
| WO | 2006081020 A1 | 8/2006 |
| WO | 2006081023 A2 | 8/2006 |
| WO | 2007126582 | 11/2007 |
| WO | 2011033752 A1 | 3/2011 |

OTHER PUBLICATIONS

Office Action for Korean Application No. 10-2024-7013479 dated Oct. 23, 2025.

Office Action for Japanese Application No. 2024-524649 dated Jun. 3, 2025.

Office Action from Taiwanese Patent Application No. 111126972 dated Nov. 27, 2025.

Search Report from Taiwanese Patent Application No. 111126972 dated Nov. 18, 2025.

* cited by examiner

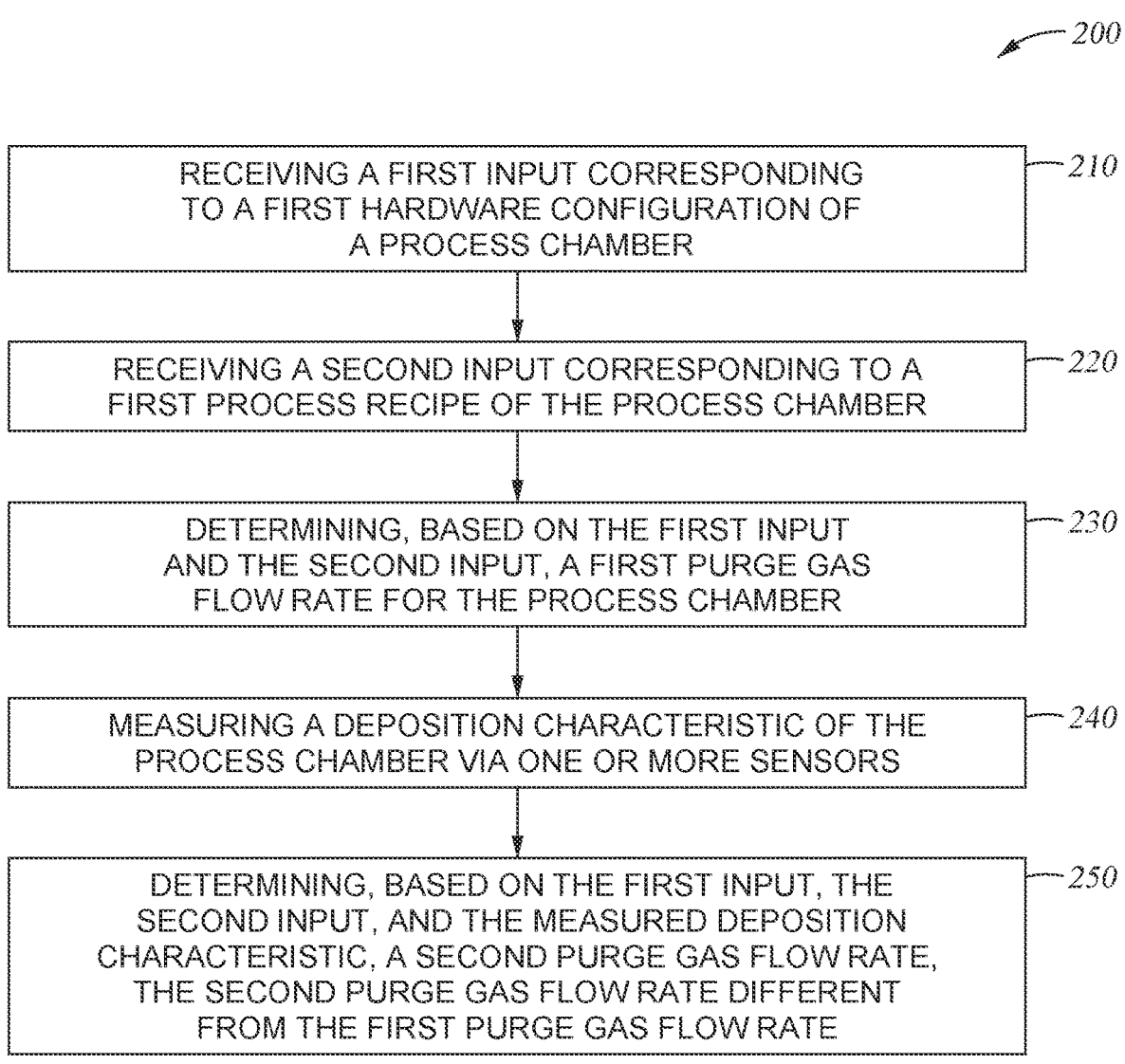

*200*

RECEIVING A FIRST INPUT CORRESPONDING
TO A FIRST HARDWARE CONFIGURATION OF
A PROCESS CHAMBER — *210*

RECEIVING A SECOND INPUT CORRESPONDING TO A
FIRST PROCESS RECIPE OF THE PROCESS CHAMBER — *220*

DETERMINING, BASED ON THE FIRST INPUT
AND THE SECOND INPUT, A FIRST PURGE GAS
FLOW RATE FOR THE PROCESS CHAMBER — *230*

MEASURING A DEPOSITION CHARACTERISTIC OF THE
PROCESS CHAMBER VIA ONE OR MORE SENSORS — *240*

DETERMINING, BASED ON THE FIRST INPUT, THE
SECOND INPUT, AND THE MEASURED DEPOSITION
CHARACTERISTIC, A SECOND PURGE GAS FLOW RATE,
THE SECOND PURGE GAS FLOW RATE DIFFERENT
FROM THE FIRST PURGE GAS FLOW RATE — *250*

*Fig. 2*

| CASE DESCRIPTION | PURGE | WAFER | SUBSTRATE SUPPORT BACKSIDE | LOWER WINDOW |
|---|---|---|---|---|
| HARDWARE CONFIGURATION A, PROCESS RECIPE 1 | 6 | 0.47 | 0.01 | 0.00 |
|  | 6 | 0.57 | 0.10 | 0.10 |
| HARDWARE CONFIGURATION B, PROCESS RECIPE 1 | 18 | 0.52 | 0.02 | 0.01 |
|  | 30 | 0.46 | 0.00 | 0.00 |
| HARDWARE CONFIGURATION C, PROCESS RECIPE 1 | 6 | 0.49 | 0.04 | 0.00 |
|  | 6 | 0.59 | 0.13 | 0.14 |
| HARDWARE CONFIGURATION D, PROCESS RECIPE 1 | 18 | 0.53 | 0.03 | 0.02 |
|  | 30 | 0.47 | 0.01 | 0.01 |

*Fig. 3E*

MODEL-BASED PURGE GAS FLOW

BACKGROUND

Field

The present disclosure generally relates to methods for processing semiconductor substrates, particularly the deposition, modification, or removal of semiconductor film materials on a substrate. In particular, the present disclosure relates to methods and apparatus for determining purge gas flow in a process chamber.

Description of the Related Art

Semiconductor substrates are processed for a wide variety of applications, including the fabrication of integrated devices and microdevices. One method of processing substrates includes depositing a material, such as a semiconductor material or a conductive material on an upper surface of the substrate. The deposition, modification, or removal of semiconductor materials on a substrate depends in large part on a flux of purge and process gases across the surface of the substrate. During a deposition operation, the process gas and the purge gas, such as an inert gas, flow simultaneously into a process chamber, such as an epitaxial (EPI) chamber. One purpose of the purge gas is to reduce the likelihood of the process gas expanding beyond the substrate into hard to reach areas of the process chamber and depositing an unwanted layer of film on chamber surfaces. Unwanted layers of film lead to an increase in preventable maintenance and a subsequent decrease in overall throughput. For example, these sporadic and undesirable depositions can lead to backside coating of the substrate support, coating on optically transparent surfaces, and/or coating and/or condensation between the liners or around the lift rotation mechanism inside the process kit, which, in turn, can lead to particle issues and process drift. Without purge gas, or with too little purge gas flow, additional particle issues may also result when unevacuated precursor or process particles are exposed to air during substrate transfer.

If the purge gas has a flow rate which is too low, the purge gas will not sufficiently reduce the likelihood of the process gas reaching these hard to clean areas of the process chamber and prevent the aforementioned issues. However, if the flow rate of the purge gas is too high, the purge gas will dilute and displace the process gas, slowing the deposition process, reducing throughput, and, potentially, creating non-uniformities across the substrate during the deposition process which can lead to process drift.

Thus, there is a need for methods that improve purge gas flow rate into a process chamber.

SUMMARY

In one embodiment, a method for processing a semiconductor substrate is provided. The method includes receiving a first input corresponding to a first geometric hardware configuration of a process chamber, receiving a second input corresponding to a first process recipe of the process chamber, performing a first deposition process using the first process recipe at a first purge gas flow rate in the process chamber, measuring a deposition characteristic of the first deposition process via a first sensor, determining, based on the first input, the second input, and the measured deposition characteristic, a second purge gas flow rate, the second purge gas flow rate different from the first purge gas flow rate, and performing a second deposition process at the second purge gas flow rate.

In another embodiment, a method is provided. The method includes receiving a first input corresponding to a first hardware configuration of a process chamber; receiving a second input corresponding to a first process recipe of the process chamber; performing a first deposition process using the first process recipe at a first purge gas flow rate in the process chamber; measuring a deposition characteristic of the first deposition process at a first location via a first sensor; determining, based on the first input, the second input, and the measured deposition characteristic, a second purge gas flow rate, the second purge gas flow rate different from the first purge gas flow rate; performing a second deposition process using the second purge gas flow rate in the process chamber; measuring the deposition characteristic of the second deposition process at the first location via the first sensor; and determining, based on a change in the measured deposition characteristic, a third purge gas flow rate, the third purge gas flow rate different from the second purge gas flow rate.

In yet another embodiment, a non-transitory computer readable medium is provided. The non-transitory computer readable medium includes instructions that when executed by a processor, cause the processor to: receive a first input corresponding to a first geometric hardware configuration of a process chamber, receive a second input corresponding to a first process recipe of the process chamber, perform a first deposition process using the first process recipe at a first purge gas flow rate in the process chamber, measure a deposition characteristic of the first deposition process via a first sensor, determine, based on the first input, the second input, and the measured deposition characteristic, a second purge gas flow rate, the second purge gas flow rate different from the first purge gas flow rate, and perform a second deposition process at the second purge gas flow rat.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

FIG. 2 is a method of adjusting purge gas flow rate according to embodiments of the present disclosure.

FIG. 3E is a comparison table of a measured deposition characteristic of a backside of a substrate support, a substrate, and a portion of a window in a chamber as a function of both different hardware configurations and different purge gas flow rates according to the graphs of FIGS. 3A-3D.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure relates to methods for purging process chambers. Methods provided herein allow for increased throughput and deposition uniformity and a decrease in overall product downtime as well as reduced cleaning duration.

In place of a constant purge gas flow rate, embodiments of the present disclosure provide a variable purge gas flow rate which can be adjusted for a variation of geometric hardware configurations and process recipes. As used herein, the phrase "process recipe" refers to a finite number of process conditions to perform a predetermined operation on a substrate, such as a semiconductor wafer. According to embodiments of the present disclosure, the adjustment of the purge gas flow rate does not substantially dilute a process gas over a substrate, but successfully reduces the likelihood of the process gas expanding beyond the substrate into hard to reach areas of the process chamber and depositing an unwanted layer of film. In turn, a lesser amount of preventable maintenance (and, henceforth, a lesser amount of product downtime) is performed and an increase in throughput is achieved. Additionally, by adjusting the purge gas flow rate during or prior to a deposition operation, methods described herein may improve overall process uniformity, such as a center-to-edge (C-E) deposition reaction uniformity.

Figure 1A:
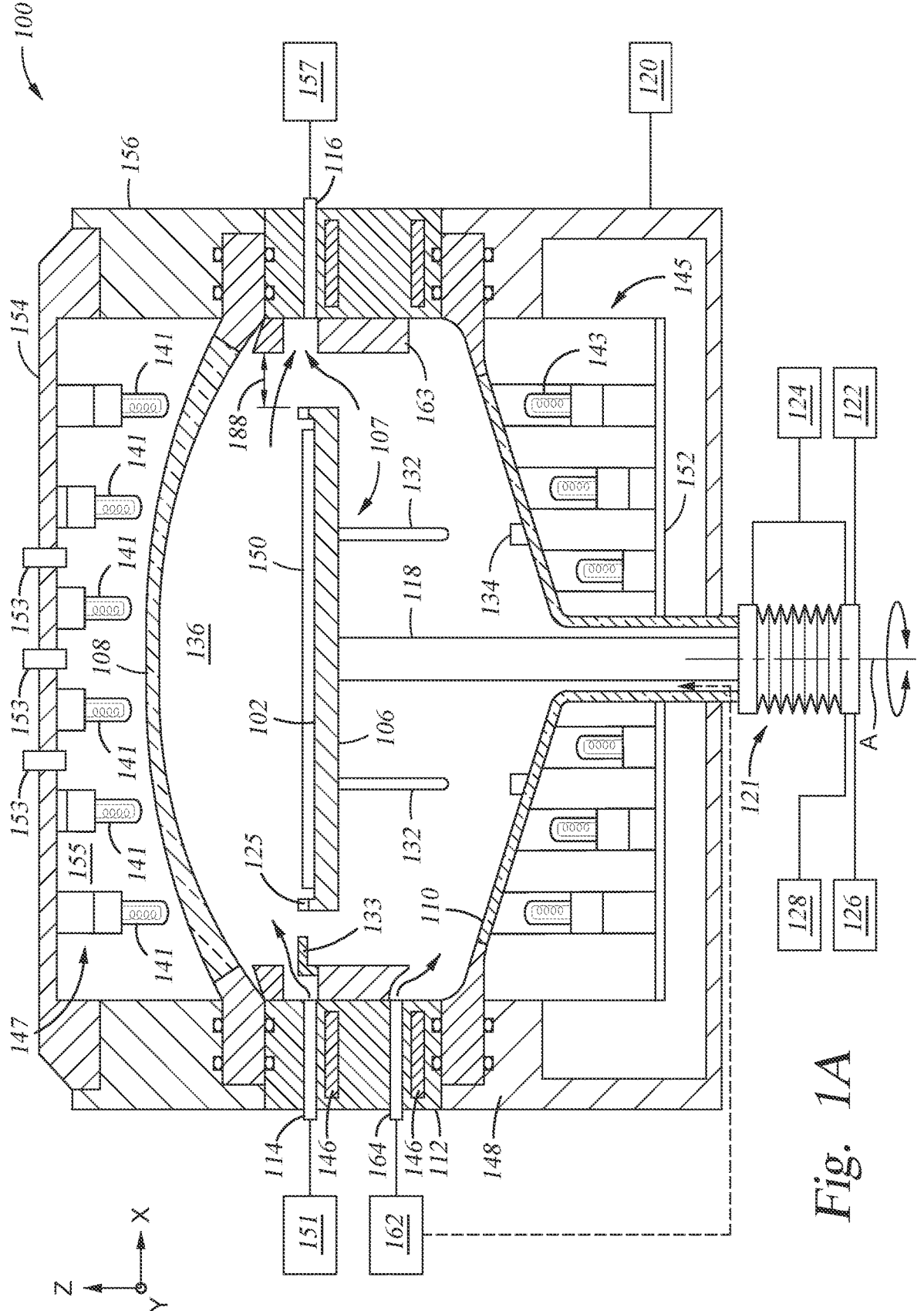
FIG. 1A is a schematic cross-sectional view of a process chamber that may be used to practice various embodiments of the disclosure.
Figure 1B:
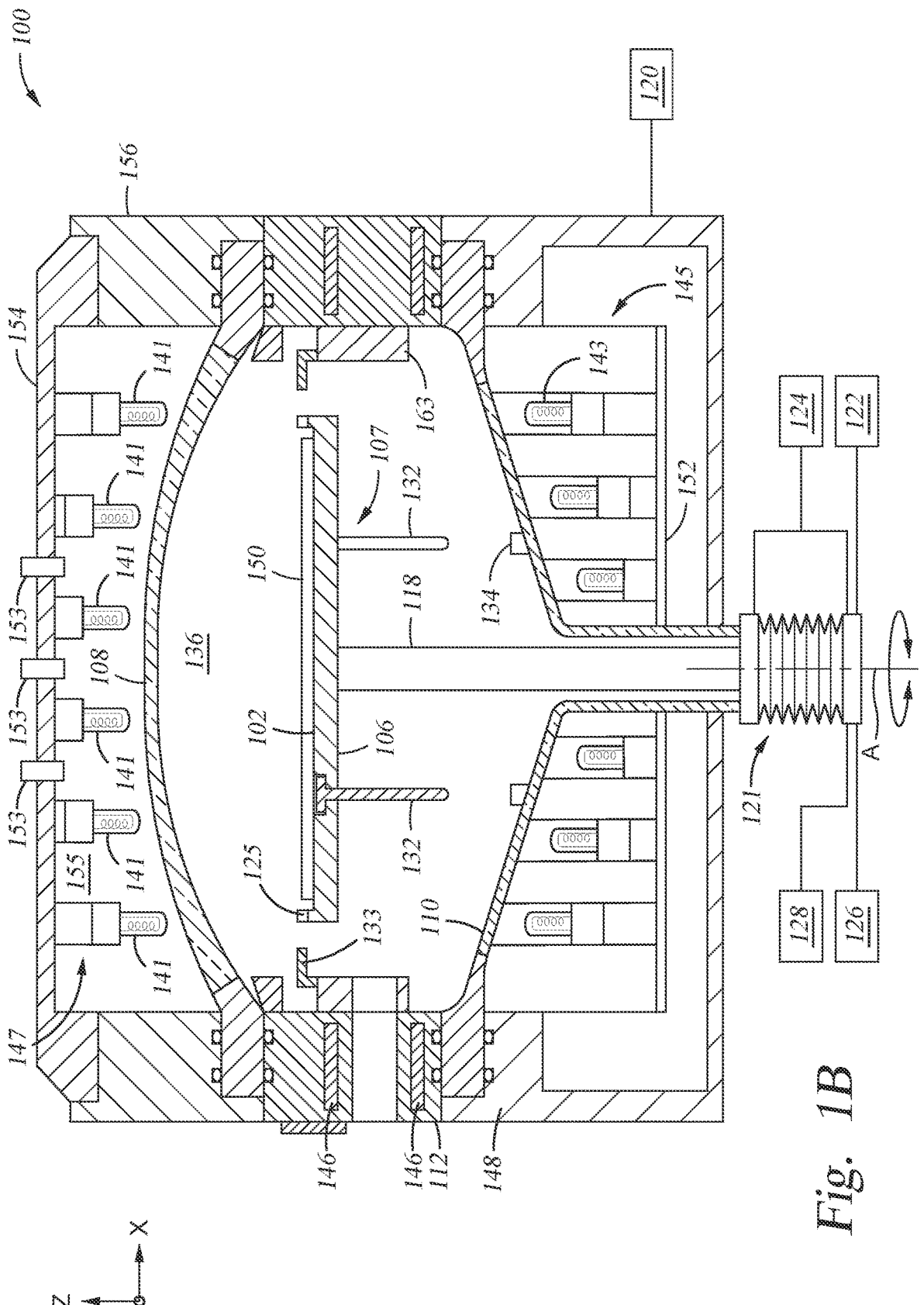
FIG. 1B is a schematic cross-sectional view of the process chamber of FIG. 1A rotated 90 degrees clockwise.

FIG. 1A is a schematic cross-sectional view of a process chamber 100 that may be used to practice various discussed in the present disclosure. FIG. 1B is a schematic plan view of the process chamber of FIG. 1A. The process chamber 100 is utilized to grow an epitaxial film on a substrate, such as the substrate 102. Substrate 102 may be, for example, a 300 mm wafer formed from silicon. However, other substrates are contemplated. The process chamber 100 is an epitaxial (EPI) chamber, however, other chambers, such as rapid thermal processing (RTP) chambers or etch chamber, are also contemplated (See FIGS. 6 and 7).

The process chamber 100 includes an upper body 156, a lower body 148 disposed below the upper body 156, and a flow module 112 disposed between the upper body 156 and the lower body 148. Optionally, cooling channels may be located in the upper body 156 and/or the lower body 148.

Collectively, the upper body 156, the flow module 112, and the lower body 148 form a chamber body. In some embodiments, the chamber body may be made of a process resistant material, such as aluminum or stainless steel. Disposed within the chamber body is a substrate support 106, an upper window 108, a lower window 110, a plurality of upper lamps 141, and a plurality of lower lamps 143. In some embodiments, the upper window 108 and/or the lower window 110 includes a transparent quartz. The substrate support 106 is disposed between the upper window 108 and the lower window 110. In some embodiments, the substrate support 106 is formed from a material having a high heat resistivity (e.g., black quartz or Aluminum Nitride) or a ceramic or graphite material covered with a silicon material such as silicon carbide. The substrate support 106 can be formed from any material that can withstand high temperature environments, such as that of a chemical vapor deposition (CVD) process. In some embodiments, the substrate support 106 is an annular ring. In other embodiments, the substrate support 106 is a disk/plate like shape which protects a bottom surface of a substrate from unwanted deposition during a deposition process. During operation, the process chamber 100 creates a flow of precursors across the top surface 150 of the substrate 102.

The plurality of upper lamps 141 are disposed between the upper window 108 and a lid 154. The plurality of upper lamps 141 form an upper lamp assembly 147. The lid 154 includes a plurality of sensors 153 disposed therein for measuring the temperature within the process chamber 100. The plurality of lower lamps 143 are disposed between the lower window 110 and a floor 152. The plurality of lower lamps 143 form a lower lamp assembly 145. In some embodiments, the upper lamp assembly 147 and/or the lower lamp assembly 145 may be disposed less than or equal to about 3 centimeters (cm) from the substrate support 106, such as about 2 cm or less above the substrate support 106. In some embodiments, the lamps 141 and/or143 may be disposed further than 3 cm from the substrate support 106. The lamps 141 and/or 143 may be disposed above and/or below the substrate support 106. In some embodiments, cooling channels 146 act as a heat sink for cooling the lower lamp assembly 145 and/or the upper lamp assembly 147.

Figure 3A:
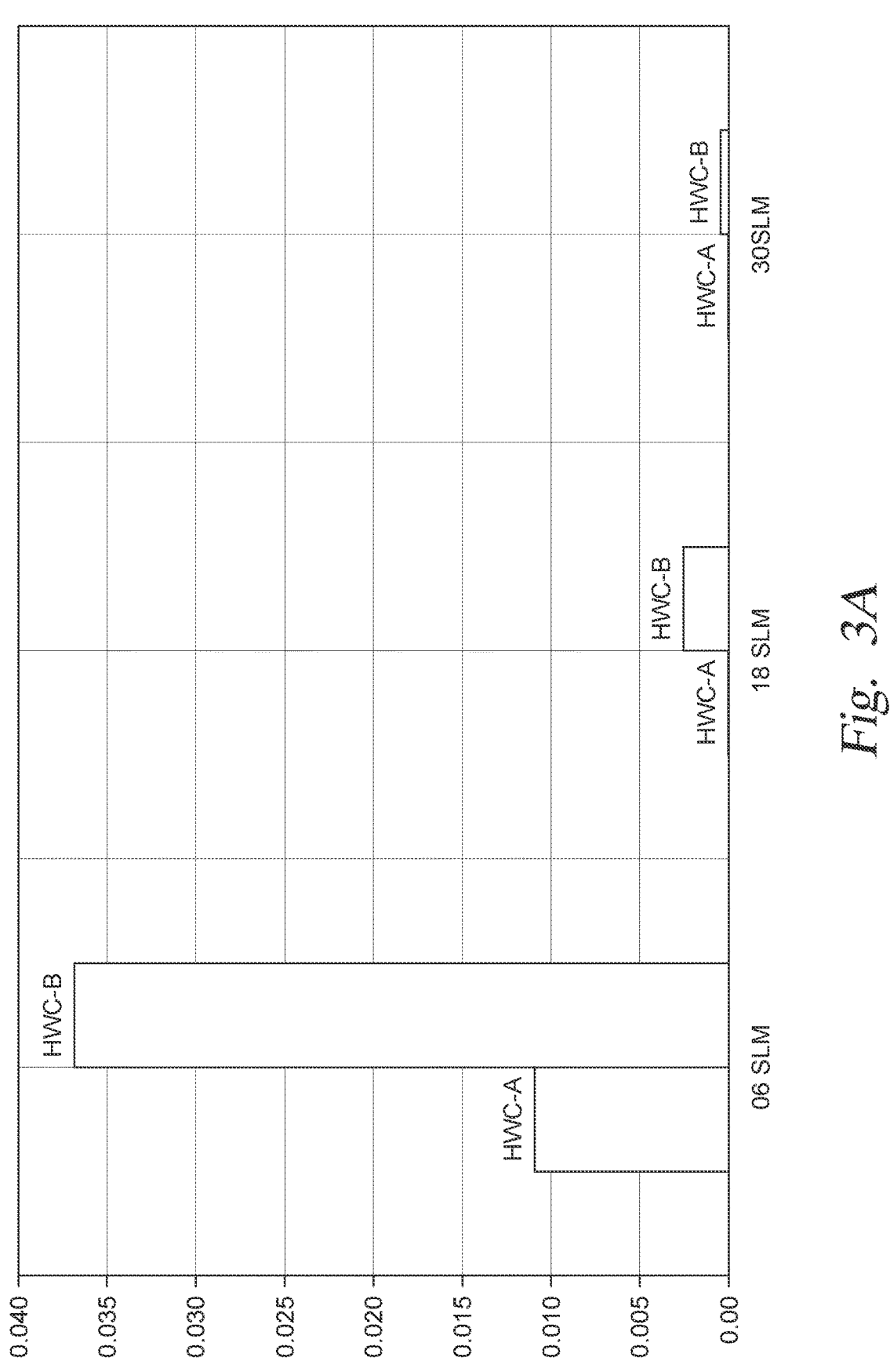
FIGS. 3A-3B are graphical comparisons of measured deposition characteristics of a lower window in a process chamber as a function of both different hardware configurations and different purge gas flow rates.

A processing volume 136 is formed between the upper window 108 and the lower window 110. The processing volume 136 contains the substrate support 106 disposed therein. A substrate 102 is disposed on a top surface of the substrate support 106 during processing. Operating pressure within the process chamber 100 may be reduced to a sub-atmospheric pressure before introducing a process gas through the inlet port 180. An optional edge ring 125 surrounds the substrate support 106. The edge ring 125 may be a part of or may be in contact with the substrate support 106. In some embodiments, the substrate 102 is disposed on a top surface of the edge ring 125. The process chamber 100 further includes a pre-heat ring 133. The pre-heat ring 133 is configured to be disposed around the periphery of the substrate support 106 while the substrate support 106 is in a processing position. In some embodiments, an overlapped substrate support is utilized such that a gap 188 between the pre-heat ring 133 and the substrate support 106 is minimized. The overlap may be achieved by an additional substrate support component coupled to the substrate support 106. The gap 188 may be from about 0 mm to about 5 mm, such as from about 0.5 mm to about 4.5 mm, such as from about 1 mm to about 4 mm, such as from about 2 mm to about 3 mm. In some embodiments, the gap 188 may be non-uniform or asymmetric (e.g., when the substrate support is non-uniform or asymmetric, such as an ellipse). In some embodiments, as shown in FIG. 1A, the pre-heat ring 133 is coupled to a liner 163 disposed on the inner surface of the flow module 112 such that an outer surface or a lower surface of the pre-heat ring 133 is coupled to an inner surface or an upper surface of the liner 163. In some embodiments, the pre-heat ring 133 may be substantially shaped. In some embodiments, as shown in FIG. 3A, there is a "gap" in the annular pre-heat ring 133 at the one or more exhaust outlets 116.

The substrate support 106 is attached to a shaft 118. The shaft is connected to a motion assembly 121. The motion assembly 121 includes one or more actuators and/or adjustment devices that provide movement and/or adjustment of the shaft 118 and/or the substrate support 106 within the processing volume 136. The motion assembly 121 includes a rotary actuator 122 that rotates the shaft 118 and/or the substrate support 106 about a longitudinal axis A of the process chamber 100. In some embodiments, the rotary actuator 122 may be configured to rotate the substrate 102 at a rotational spin rate of greater than or equal to about 2 Hertz (Hz), such as about 4 Hz or greater. In some embodiments, the rotary actuator 122 may be configured to rotate the substrate 102 at a rotational spin rate of less than or equal to about 1 Hz, such as about 0.5 Hz or less. In some embodiments, the motion assembly 121 further includes a vertical actuator 124 to lift and lower the substrate support 106 in the z-direction. The motion assembly includes a tilt adjustment device 126 that is used to adjust the planar orientation of the substrate support 106 and a lateral adjustment device 128 that is used to adjust the position of the shaft 118 and the substrate support 106 side to side within the processing volume 136. In some embodiments, the substrate support 106 may be stationary. In other embodiments, the substrate support 106 may rotate about a longitudinal axis (e.g. the x-axis).

The substrate support 106 may further include lift pin holes 107 disposed therein. The lift pin holes 107 are sized to accommodate a lift pin 132 for placing and/or lifting of the substrate 102 to or from the substrate support 106 either before or after a deposition process is performed, respectively. The lift pins 132 may rest on lift pin stops 134 when the substrate support 106 is lowered from a processing position to a transfer position.

The flow module 112 includes a plurality of process gas inlets 114, a plurality of flow module purge gas inlets 164, and one or more exhaust gas outlets 116. One or more cooling channels 146 are disposed below the plurality of process gas inlets 114. As shown in FIG. 1A, one cooling channel 146 is shown below the plurality of process gas inlets 114 and above a slit valve 135 and another cooling channel 146 is shown below the plurality of flow module purge gas inlets 164. The cooling channels 146 may be annular. A slit purge gas may flow from a slit inlet (not shown) in the slit valve 135 and exit either at the one or more exhaust gas outlets 116 or at a slit outlet (not shown) in the slit valve 135. Further, holes or slits in the liner 163 may allow for gases to exhaust to gas outlets 116. It is contemplated that the positions of the slit inlet and the slit outlet may be switched depending on the chosen configuration. In some embodiments, a rotation purge gas may flow from a rotation inlet (not shown) at the bottom of the process chamber 100, around the shaft 118, and exit at the one or more exhaust gas outlets 116. In some embodiments, each of the different purge gases may be exhausted by exhaust vents, such as slits or holes in the liner 163, prior to reaching the one or more gas outlets 116.

The liner 163 is disposed on the inner surface of the flow module 112 and protects the flow module 112 from reactive gases used during deposition processes. A liner purge gas may flow in between the liner 163 and the chamber body and exit at the one or more exhaust gas outlets 116. The flow module purge gas, the slit purge gas, the rotation purge gas, and/or the liner purge gas may be an inert gas, such as one or more of helium, hydrogen, nitrogen and argon. The flow module purge gas, the slit purge gas, the rotation purge gas, and/or the liner purge gas may further include an etchant for affecting selectivity of deposited film or cleaning areas that are being purged. In some embodiments, the liner 163 is split into an upper liner and a lower liner and the lower liner has holes formed along an inner surface thereof to form a vented lower liner whereby gas within the lower portion of the chamber may be vented directly to an exhaust, such as exhaust pump 157. The vented lower liner may have from about 1 to about 30 holes, such as from about 5 to about 20 holes, and each hole may be from about 1 mm to about 6 mm, such as from about 3 mm to about 4 mm. The purpose of the flow module purge gas, the slit purge gas, the liner purge gas, and the rotation purge gas, is to create a local positive pressure and prevent an increase in the precursor gas and/or process gas concentration in the areas in which each purge gas flows as well as to help to maintain the chamber clean both during and between processing operations, such as a deposition operation. In some embodiments, a flow module purge gas flow rate and a slit purge gas flow rate can more dominantly affect the process conditions on the substrate. As used herein, "the purge gas" may refer to any one or combination of the flow module purge gas which flows from the plurality of flow module purge gas inlets 164, the slit purge gas, the liner purge gas, and the rotation purge gas. As used herein, "the purge gas flow rate," and variations thereof such as "the first purge gas flow rate" or "the second purge gas flow rate," may refer to any one or combination of the flow module purge gas flow rate, the slit purge gas flow rate, a liner purge gas flow rate, and a rotation purge gas flow rate.

The process gas inlet 114 is positioned to flow a gas parallel to the top surface 150 of a substrate 102, while the flow module purge gas inlets 164 are positioned to flow a purge gas beneath the substrate support 106. The process gas inlet 114 is fluidly connected to a process gas source 151. The flow module purge gas inlets 164 are fluidly connected to a purge gas source 162. In some embodiments, the purge gas source 162 is fluidly connected to an inlet at the base of the shaft 118, as shown in phantom lines on FIG. 1A. The one or more exhaust gas outlets 116 are fluidly connected to an exhaust pump 157. Each of the process gas source 151 and the purge gas source 162 may be configured to supply one or more precursors or process gases into the processing volume 136. Precursor gases and/or process gases may include one or more of dichlorosilane (DCS), trichlorosilane (TCS), or disilane (DS), higher order silanes, such as trisilane and tetrasilane, and metal-organic precursors, such as trimethylaluminum (TMA) and tetraethylorthosilicate (TEOS). However, other gases are also contemplated. As shown in FIG. 1A, a controller 120 is in communication with the process chamber 100 and is used to control processes, such as those described herein.

The process chamber 100 is configured to receive the substrate 102 through a slit valve 135. The slit valve 135 may be coupled to a transfer chamber having a transfer robot therein. The slit valve 135 allows the substrate 102 to be loaded into and removed from the processing volume 136 of the process chamber 100 through an opening (e.g., using a robotic end effector of the transfer robot). A door (not shown) closes over and seals off the opening (not shown) to allow the environment of the processing volume 136 to be controlled independently of ambient conditions outside of the process chamber 100.

The various gas inlets, such as the plurality of process gas inlets 144 and the plurality of flow module purge gas inlets 164, may be configured to provide individual or multiple gas flows with varied gas parameters such as velocity, density, or composition. In some embodiments, as shown in FIG. 1B, the one or more exhaust outlets 116 are located 180 degrees from the plurality of process gas inlets 114 and the plurality of flow module purge gas inlets 164 in a cross-flow configuration. In the cross-flow configuration, the slit valve 135 may be located 90 degrees clockwise (as shown in FIG. 1B) or counterclockwise from the one or more exhaust outlets 116. In some embodiments, slit valve 135 may be located below the inlet (e.g., slit valve 135 may be located at 0 degrees from the inlet location). The process chamber 100 may further include an additional gas inlet (not shown) to provide an optional crossflow gas, which facilitates tuning of deposition uniformity. As shown in FIG. 1B, the additional gas inlet is located 180 degrees from the slit valve 135. However, it is contemplated that the additional gas inlet and the slit valve 135 may coincide with each other (e.g., being located on the same side of the process chamber 100). In some embodiments, the one or more exhaust outlets 116 are located 180 degrees from the slit valve 135 and 270 degrees counterclockwise from the plurality of process gas inlets 114 and the plurality of flow module purge gas inlets 164 in a turned configuration. In this turned configuration, when the substrate 102 is rotated in a counterclockwise direction, gas flow is swept at least 270 degrees around the interior of the process chamber 100 before being exhausted through the one or more exhaust outlets 116. However, the one or more exhaust outlets 116, the additional gas inlet, the plurality of process gas inlets 114, the slit valve 135, and the plurality of flow module purge gas inlets 164 may be positioned at various optional locations relative to each other. In some examples, the outlet port 190 is level on an X-Y plane with the inlet port 180.

FIG. 2 is a method 200 of adjusting the purge gas flow rate according to some embodiments of the present disclosure. At operation 210, a controller 120 receives a first input. The first input may be input by a user or selected from a library or database of information stored by the controller 120. The first input corresponds to a first geometric hardware configuration of the process chamber 100. In some embodiments, the first geometric hardware configuration includes one or more of flow type, pre-heat ring position, substrate support position, inlet locations, slit valve and outlet locations, a non-vented or vented liner, a circular or elliptical pre-heat ring, an overlapped substrate support, dome or liner replacements, and any other new or replaced hardware within the process chamber.. The first geometric hardware configuration of the first input may take into account the life and/or current age of one or more hardware components. For example, a newly replaced hardware component, although identical to the previous hardware component, may alter the necessary purge gas flow rate due to differing levels of wear and initial machining tolerance. In some examples, the first input may reference a library or database of values related to chamber hardware or hardware characteristics, such as dimensions.

At operation 220, the controller 120 receives a second input. The second input may be input by a user or selected from a library or database of information stored in a memory and referenced by the controller 120. The second input corresponds to a first process recipe of the process chamber. In some embodiments, the first process recipe includes at least one process condition such as a chamber temperature, a chamber pressure, purge gas flow rates, process gas flow rates, substrate support rotation speed, substrate support vertical position, duration, and/or gas compositions.

At operation 230, the first input and the second input are used in order to determine a first purge gas flow rate. In one example, the purge gas flow rate for each recipe includes a "default" setting, in which purge gas flow rate, timing, and/or composition is associated therewith. The default purge gas setting may be empirically determined, and stored in a memory or database to be called upon when a desired hardware configuration and/or recipe is selected. In another example, the first purge gas flow rate is determined by a machine learning (ML) model 404 which selects a flow rate from a library or catalog of previous lab data and based upon the first and second inputs. For example, the ML model 404 determines the first purge gas flow rate and displays the determined value to the user or the ML model 404 determines the first purge gas flow rate and adjusts the purge gas flow rate automatically to match the determined value).

At operation 240, one or more first sensors are used to measure a first deposition characteristic of the substrate or other chamber component. In some embodiments, the first deposition characteristic may be a thickness, a color, a mass fraction, overall range, a C-E variation, a transmissivity, a transparency, a reflectivity, a roughness, and/or emissivity. The one or more first sensors may include a single or multi-color pyrometer, a wide bandwidth optical spectrometer, an optical reflectometer, a camera, a thermal camera, another device for physical sensor feedback, or any combination thereof. The one or more first sensors are outside of the lower window 110 and the upper window 108 such that one or more first sensors have a direct line of sight to a desired target area. For example, one or more optical spectrometers and/or one or more thermal cameras may be aimed at or through the lower window 110 in multiple locations where higher deposition is expected, and/or one or more pyrometers may be aimed through the lower window 110 at the back of the substrate support 106. In one example, the signal from the one or more optical spectrometers can be correlated with a loss of transmissivity or increased occlusion of portions of the lower window 110 which is indicative of coating development. In-situ image analysis of the images from the one or more cameras can be similarly correlated with coating development on the lower window 110. The metrology data (e.g., physical sensor feedback) from the one or more first sensors may be used by the ML model 404 or other neural network for supervised or unsupervised self-learning to adjust purge gas flow rates and achieve improved and/or desired process results, such as deposition uniformity and increased throughput. For example, purge gas flow rates may be adjusted by the ML model after comparing a predicted backside coating to a measured backside coating to correct for excess deposition on the chamber components, or to correct for uneven/undesired deposition on a substrate.

At operation 250, the first input, the second input, and the measured deposition characteristic are used in order to determine a second purge gas flow rate. In some embodiments, the second purge gas flow rate is determined by a machine learning (ML) model 404 (e.g., the ML model 404 determines the first purge gas flow rate and displays the determined value to the user or the ML model 404 determines the first purge gas flow rate and adjusts the purge gas flow rate automatically to match the determined value). The second purge gas flow rate may be different from the first purge gas flow rate and the difference between the second purge gas flow rate and the first purge gas flow rate may be based, in whole or in part, upon the measured deposition characteristic. As previously discussed, the first purge gas flow rate and the second purge gas flow rate may refer to the flow module purge gas, the slit purge gas, the rotational purge gas, and/or the liner purge gas.

The ML model 404 (shown in FIG. 4) is particularly beneficial in that the model is configured to multiple purge gas variables and make a single correction based on those variables. In conventional systems, a change to one variable, such as rotational purge, has unintended consequences at other chamber locations, which may generate new issues. Such conventional systems tend to leave operators "chasing" configurations in that a first change in process conditions may lead to an unintended consequence at another location in a chamber, which can necessitate a second change in process conditions, which can further necessitate a third change, and so on. However, the ML model 404 can learn to anticipate these changes, and may necessary adjustments to eliminate this chasing issue. Further, it is contemplated that the ML model 404 may include, or may interact with, a "digital twin" of a process chamber. The digital twin is configured according to the first input of operation 210. A fluid dynamics simulation may be performed on the digital twin based on revisions suggested by the ML model 404 to determine fluid flow affects within the digital twin, and conversely, within the actual process chamber.

Use of the digital twin eliminates "trial and error" or "chasing" on a physical process chamber to determine improved and/or optimum processing conditions, such as purge flow rates. It is contemplated that the digital twin and/or the ML model 404 may be updated based on feedback from one or more sensors in the physical process chamber, thereby improving results. Such feedback is valuable in both ensuring an accurate digital twin model. Moreover, such feedback facilitates updates of the digital twin due to specification deviations of hardware components from input values. For example, the physical dimensions of hardware components may change due to repeated processing within the physical chamber, and as such, the digital twin model may not accurate reflect the physical model. Feedback provided by sensors within the physical chamber allows deviations from the digital twin to be identified (for example, because a digital twin purge gas recipe may indicate no deposition occurring on a lower window, when a physical chamber sensor still indicates deposition forming on a lower window), and thus, the ML model 404 can "learn" to account for these deviations to improve physical chamber processing by providing updated process recipe parameters.

Optionally, operations 240-250 are repeated such that multiple measurements of a deposition characteristic may be compared. In some embodiments, a contrast curve analysis may be created in order to compare the measured deposition characteristic as a function of the purge gas flow rate. In some embodiments, operations 240-250 are repeated one or more times during a process, such as a deposition process, and the purge gas flow rate is adjusted in real time either by the ML model 404 or manually.

A graphical comparison of the measured deposition characteristic for different hardware configurations, process recipes, and/or purge gas flow rates can be created, as shown in FIGS. 3A-3E. For FIGS. 3A-3E, the process recipe was kept constant in order to compare a deposition characteristic as a function of different hardware configurations and purge gas flow rates. As illustrated, small changes in physical components can lead to large differences in deposition characteristics. However, the ML model 404 of the present disclosure can account for these changes, reducing unwanted deposition in undesired locations.

Figure 3B:
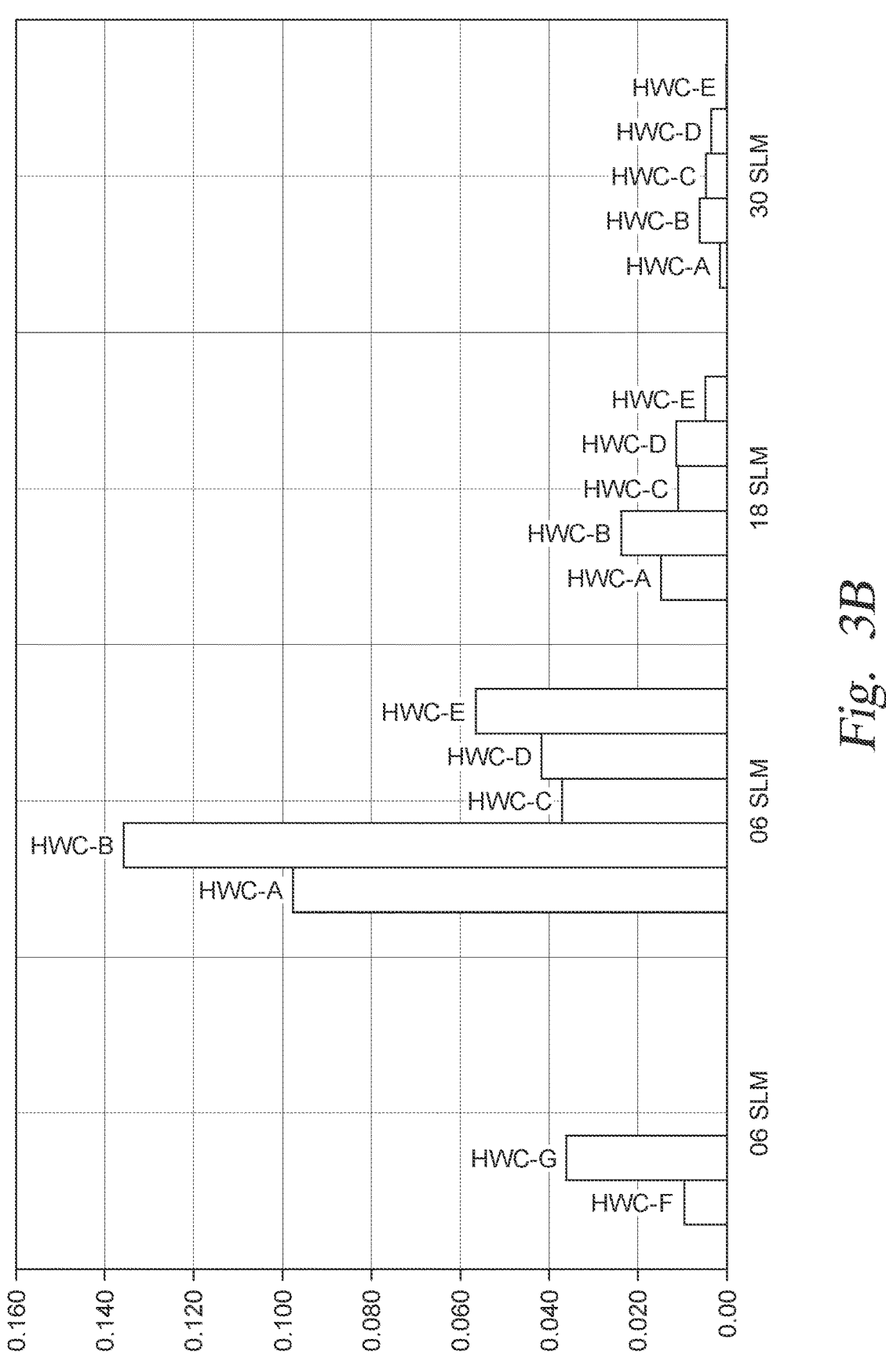

FIGS. 3A-3B are a graphical comparison of a measured deposition on a lower window in a process chamber as a function of both different hardware configurations (see bars on graph) as well as different purge gas flow rates (see x-axis labels). Hardware configuration A (left bar, HWC—A) includes a first preheating ring and hardware configuration B (right bar, HWC—B) includes a second preheating ring. In some embodiments, the first and/or second preheating ring may be symmetric or asymmetric. As used herein, symmetric and asymmetric may refer to uniformity or non-uniformity. As can be seen from FIG. 3A, hardware configuration A shows a lessened measured deposition compared to hardware configuration B for each purge gas flow rate. Thus, adjusting the purge gas flow rate for FIG. 3A may include increasing the purge gas flow rate in order to lessen the measured deposition of the lower window of the process chamber, where deposition is undesirable. Notably, different hardware configurations result in more or less deposition on surface components when using the same process recipe. However, aspects of the disclosure can account for these differences and reduce undesired outcomes.

Figure 3C:
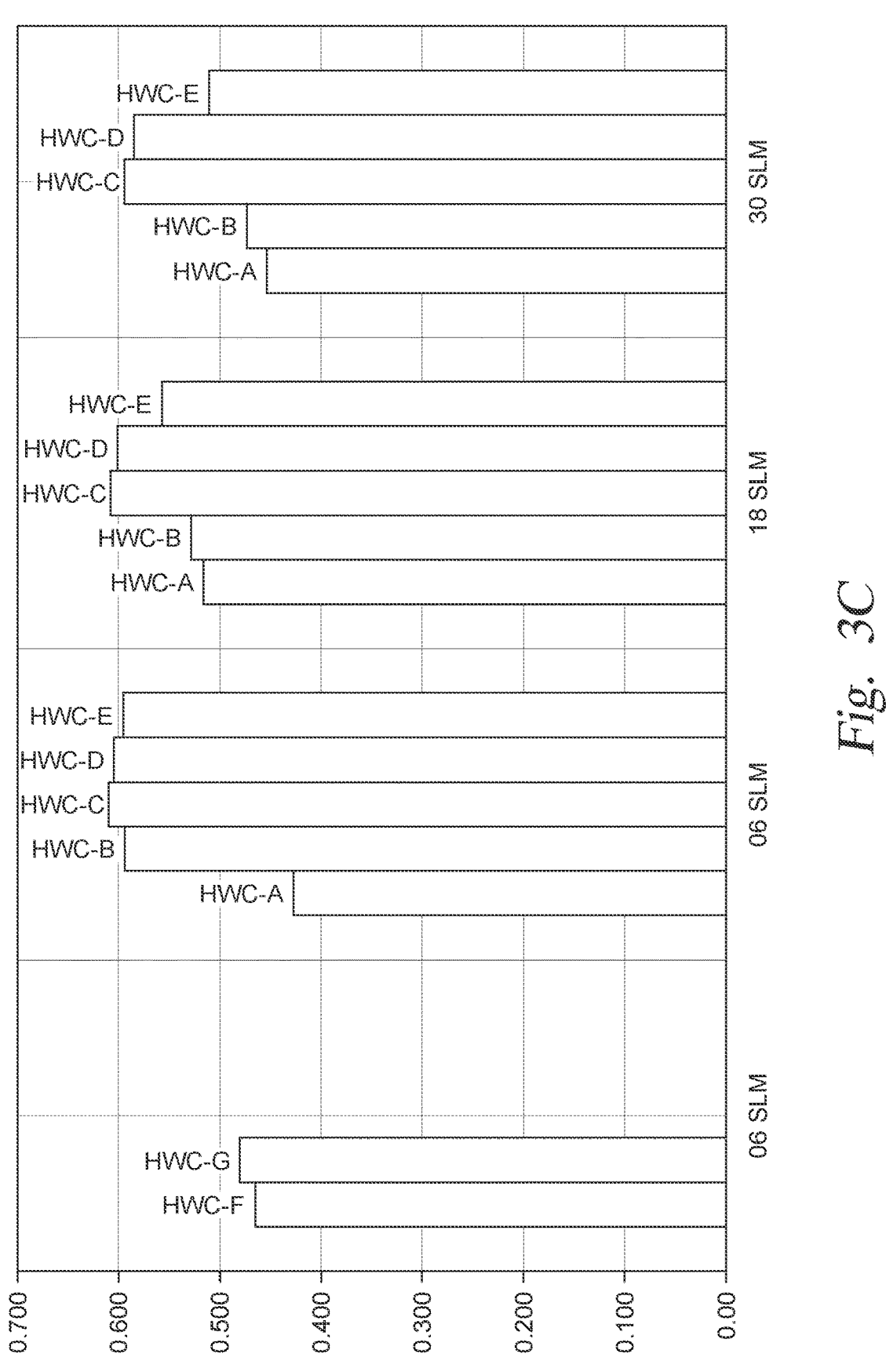
FIG. 3C is a graphical comparison of a measured deposition characteristic on a substrate in a process chamber as a function of both different hardware configurations and different purge gas flow rates.
Figure 3D:
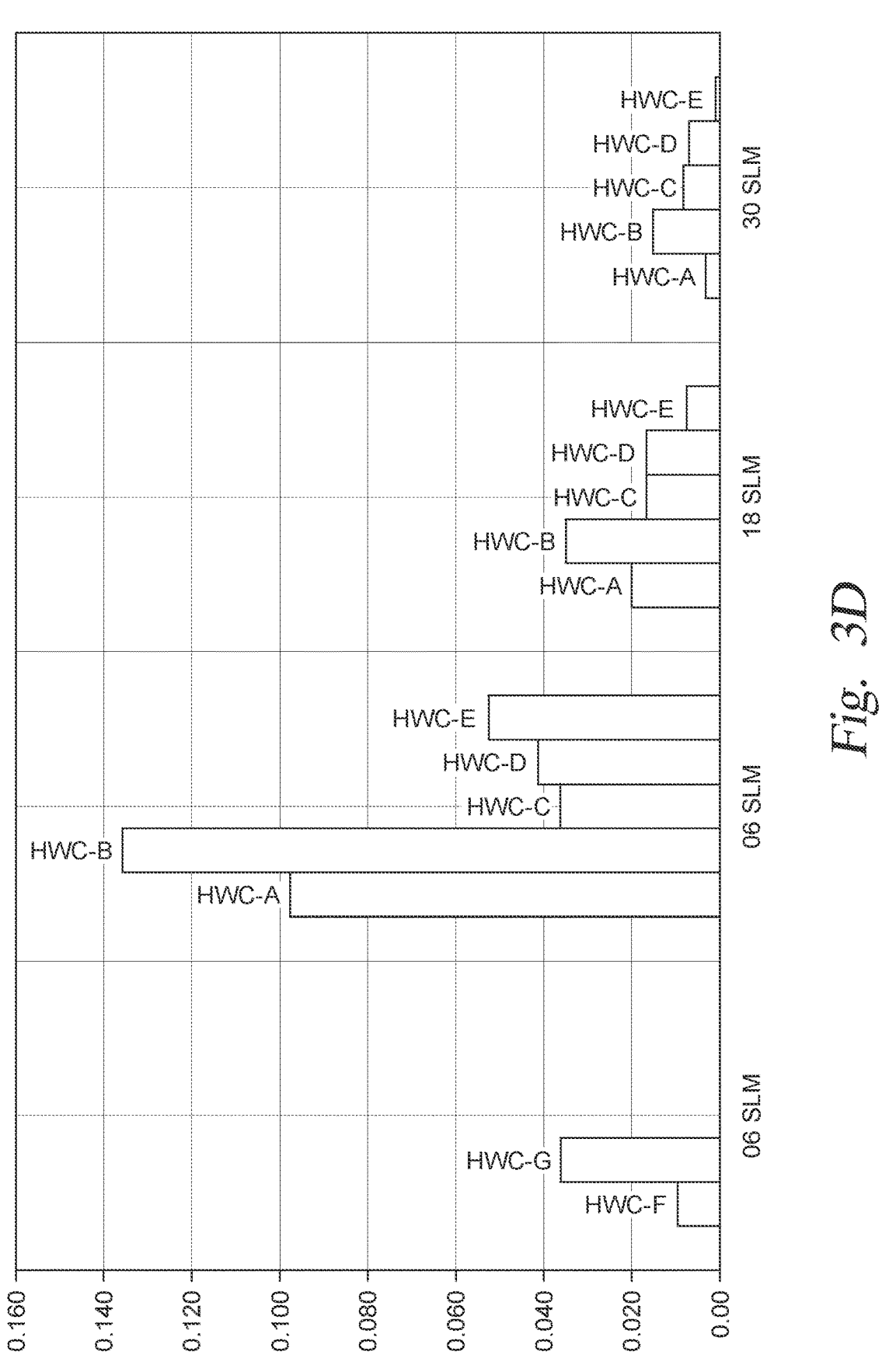
FIG. 3D is a graphical comparison of a measured deposition characteristic of a backside of a substrate support in a process chamber as a function of both different hardware configurations and different purge gas flow rates.

In FIG. 3B-3D, Hardware configurations A-G include a first, second, third, fourth, and fifth preheating ring, respectively, and a first, second, third, fourth, and fifth liner, respectively. In some embodiments, one or more of the first, second, third, fourth, and fifth preheating rings may be symmetric or asymmetric and one or more of the first, second, third, fourth, and fifth liner may be a vented liner. As can be seen from FIG. 3B, hardware configuration B generally leads to an increase in deposition on the lower window for all purge gas flow rates. Hardware configurations C, D, and E, on the other hand, each display a higher comparative deposition than the other two for different purge gas flow rates. Further, as the purge gas flow rate is increased, the measured deposition is further lessened for all hardware configurations. Thus, adjusting the purge gas flow rate for FIG. 3B may include either decreasing or increasing the purge gas flow rate in order to lessen the measured deposition on the lower window of the process chamber, where deposition is undesirable, depending upon the hardware configuration of the process chamber utilized. Thus, different hardware configurations, in combination with different recipe conditions, indicate different purge gas flow rates in order to avoid an unacceptably high deposition characteristic of the lower window in the process chamber, where deposition is undesirable. This specific purge gas flow rate indicated in order to avoid an unacceptably high deposition characteristic is the lower threshold of purge gas flow rate for the lower window. An unacceptably high deposition characteristic depends on the desired precision of the thin film application process and applications of the thin film itself. For example, beyond about 5% reduction in transparency of quartz and/or beyond about 0.1% change in emissivity of a substrate may be considered unacceptable.

FIG. 3C is a graphical comparison of a measured deposition on a substrate in a process chamber as a function of both different hardware configurations (see bars on graph) as well as different purge gas flow rates (see x-axis labels). As can be seen from FIG. 3C, different hardware configurations each display a higher or lower deposition than the others for different purge gas flow rates. Further, as the purge gas flow rate is increased, the measured deposition is lessened. Thus, adjusting the purge gas flow rate for FIG. 3C may include decreasing the purge gas flow rate in order to increase the measured deposition on a substrate in the process chamber, where deposition is desirable. Thus, different hardware configurations, in combination with different recipe conditions, demand different amounts of slit purge gas flow in order to avoid an unacceptably low deposition on the substrate in the process chamber, where deposition is desirable. This specific amount of purge gas flow rate required in order to avoid an unacceptably low deposition is an upper threshold of allowable purge gas flow rate. . An unacceptably low deposition characteristic depends on the desired precision of the thin film application process and applications of the thin film itself. For example, beyond about a 5% reduction in deposition on a substrate may be considered unacceptable.

The unacceptably low deposition on the substrate in the process chamber may also include a substantial issue with deposition uniformity. A substantial issue with deposition uniformity on a substrate depends on the desired precision of the thin film application process. For example, a nonuniformity beyond about 1% on a substrate may be considered unacceptable.

FIG. 3D is a graphical comparison of a measured deposition on a backside of a substrate support in a process chamber as a function of both different hardware configurations (see bars on graph) as well as different purge gas flow rates (see x-axis labels). As can be seen from FIG. 3D, hardware configuration B shows a heightened or increased measured deposition when compared to the others hardware configurations for each purge gas flow rate and an increased purge gas flow rate generally leads to a lessened deposition for all hardware configurations. Hardware configurations C, D, and E, on the other hand, each display a higher comparative deposition than the other two for different purge gas flow rates. Thus, adjusting the purge gas flow rate for FIG. 3D may include increasing the purge gas flow rate in order to lessen the measured deposition in order to avoid an unacceptably high deposition of the backside of the substrate in the process chamber, where deposition is undesirable. This specific purge gas flow rate required in order to avoid an unacceptably high deposition is also the lower threshold of required purge gas flow rate for the backside of the substrate support. In the case of multiple lower thresholds of required purge gas flow rates for different chamber components, or different portions of a chamber component, the lowest or smallest lower threshold required purge gas flow rate may be chosen as the overall lower threshold of purge gas flow rate of the process chamber. In other embodiments, each of the different purge gas types and purge gas sources, as described, may each have individually determined purge gas flow rates.

FIG. 3E is a comparison table of a measured deposition characteristic of a backside of a substrate support, a substrate, and a lower window in a chamber according to the graphs of FIGS. 3A-3D. The process recipe was kept constant for each hardware configuration. As can be seen in FIG. 3E, an increase in purge gas flow rate, leads to a decrease in the deposition characteristic on the substrate, the backside of the substrate support, and the lower window. It is beneficial to improve the deposition characteristic on the substrate in order to reduce process time, increase deposition uniformity on the substrate, and increase overall throughput of the chamber. However, it is also beneficial to reduce the deposition characteristic of the backside of the substrate support and the lower window in order to decrease clean time and preventable maintenance and increase overall throughput of the chamber. This paradox influences the purge gas flow rate (e.g., increasing the purge gas flow rate will also increase the deposition on the substrate (favorable) and increase the deposition on other chamber components (unfavorable)).

For example, in FIG. 3E, a deposition characteristic value for the substrate is shown via a mass fraction ratio of DCS to the total amount of gas. In some examples, a lower threshold for the deposition characteristic for the substrate may be 0.50 and an upper threshold deposition characteristic value for the backside of the substrate support and the portion of the window may be 0.05. This would mean that for hardware configurations B and D, a purge flow rate should be at least 18 standard liter per minute (slm) in order to remain below the upper threshold deposition characteristic value for the backside of the substrate support and the lower window and prevent an unacceptable amount of deposition on the backside of the substrate support and the lower window. Similarly, for hardware configurations B and D, a purge flow rate should not exceed 18 slm in order to remain above the lower threshold deposition characteristic value for the substrate and retain a high enough amount of deposition on the substrate. Thus, in this example, a purge flow rate of 18 slm would be an allowable value for hardware configurations B and D and the process recipe utilized with both.

From the deposition characteristics measured with the methods described above, the sensitivity of probability of process chamber component coating can be found. The sensitivity of probability of a process chamber component coating is a measure of a concentration of precursor gas or process gas in close vicinity with the process chamber component and can be indicated by a number of physical sensor feedbacks, such as those disclosed herein.

As discussed, the controller 120 includes a ML model 404 that is trained on historical and simulated models of hardware configurations, process recipes, and known or measured deposition characteristics. Upon determining the deposition characteristics by a metrology measurement, such as via any of the sensors described herein, the trained ML model determines a simulated model to adjust the purge gas flow rate, and optionally causes the implementation of the adjusted purge gas flow rate. It is contemplated that for any intermediate values or models, regression or interpolation analysis may be used or displayed by the ML model 404.

In some embodiments, ML model 404 is a component of a larger system or process for generating adjusted purge gas flow rates. In these embodiments, some or all of the simulated model generated by the ML model 404 is utilized. In some embodiments, a modified simulated model is selected by a table lookup based on known process recipes, known hardware configurations, and/or known or measured deposition characteristics of a process chamber. In these embodiments, the table lookup determines the simulated model to select from a library of simulated models configured to adjust the purge gas flow rate of a process chamber for known hardware configurations, process recipes, and/or deposition characteristics.

According to certain embodiments, the ML model 404 may be a supervised or unsupervised Machine learning. In some embodiments, the ML model 404 is a classifier, such as a neural network, a deep learning neural network, k-means classifier, random forest walk, or the like, capable of receiving an input, for example a hardware configuration, a process recipe, such as an initial process recipe, and/or metrology data (e.g., a measured deposition characteristic) of a substrate, such as substrate 102, or other chamber component, such as lower window 110 or a backside of substrate support 106, processed by a tool, such as process chamber 100.

Figure 4:
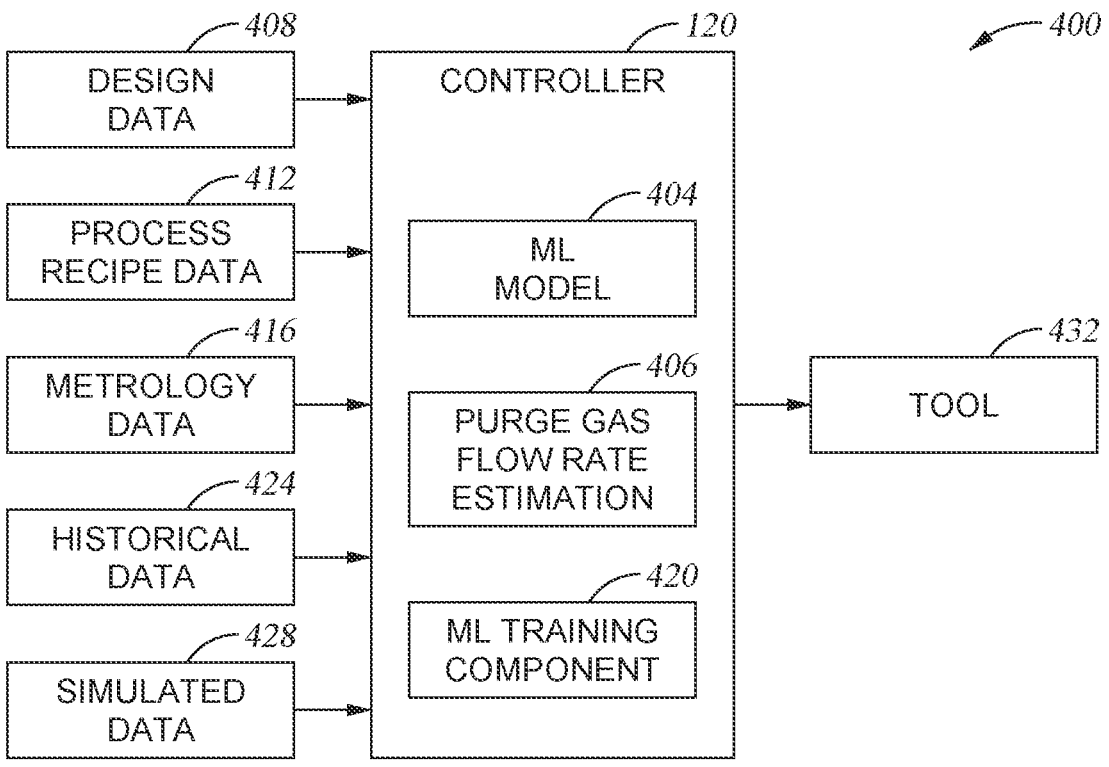
FIG. 4 is a schematic diagram of a controller according to some embodiments of the present disclosure.

FIG. 4 depicts a schematic diagram of the controller according to some embodiments of the present disclosure. As shown in FIG. 4, controller 120 receives design data 408 that includes hardware configuration data, and generates a purge gas flow rate estimation 406. Design data 408 might include or be accompanied by process recipe data 412 that includes information about the process conditions of a process chamber. For example, during operation 210, design data 408 may be provided to the ML model and during operation 220, process recipe data 412 may be provided to the ML model. Upon classification of the provided data, the ML model 404 generates the purge gas flow rate estimation 406, which is provided to a tool 432, such as the process chamber 100. The ML model 404 further receives metrology data (e.g., a deposition characteristic) 416 generated by a metrology tool, such the one or more sensors described herein. In some embodiments, the metrology tool may include more than one metrology tool and/or may measure multiple deposition characteristics. In some embodiments, the metrology tool measures one or more deposition characteristics in real time during the processing of a substrate. Upon classification of the measured deposition characteristic data, the ML model 404 generates a further purge gas flow rate estimation 406, which is provided to the tool 432, such as the process chamber 100. In some embodiments, the ML model 404 provides the purge gas flow rate estimation 406 to the tool 432 in real time during the processing of a substrate, such as by automatically adjusting the purge gas flow rate to match the further purge gas flow rate estimation 406.

The controller 120 further includes ML training component 420 for training the ML model 404. The ML training component 420 may receive historical data 424, simulated data 428, or both, to train ML model 404. Historical data 424 and simulated data 428 may include hardware configuration data, process recipe data, and/or metrology data, such as deposition characteristic data. In this context, simulated data 428 may be simulated models of estimated deposition characteristics based on known or discovered correlations between hardware configurations, process recipe conditions, and metrology data. Historical data 424 may include historical hardware configuration and/or process recipe data from previous process chambers and/or metrology data from previously measured substrates and/or other chamber components, such as a lower window or a substrate support backside (e.g., deposition characteristic data). In some embodiments, the ML model 404 is trained offline, or at a time before processing is undertaken, such as prior to operations 210 and 220. In some embodiments, training may occur during processing, such as during operations 210-250.

The ML training component 420 employs the historical data 424 and/or simulated data 428 to train the ML model 404. Once trained, the ML model 404 may receive data as described above to generate the purge gas flow rate estimation 406 which is provided to a tool 432, such as the process chamber 100. The ML model 404 may continue to store and update records and/or information on different process recipes and hardware configurations tested and save the data in historical data 424. Overtime the ML training component 420 increases the accuracy of the ML model 404.

Figure 5:
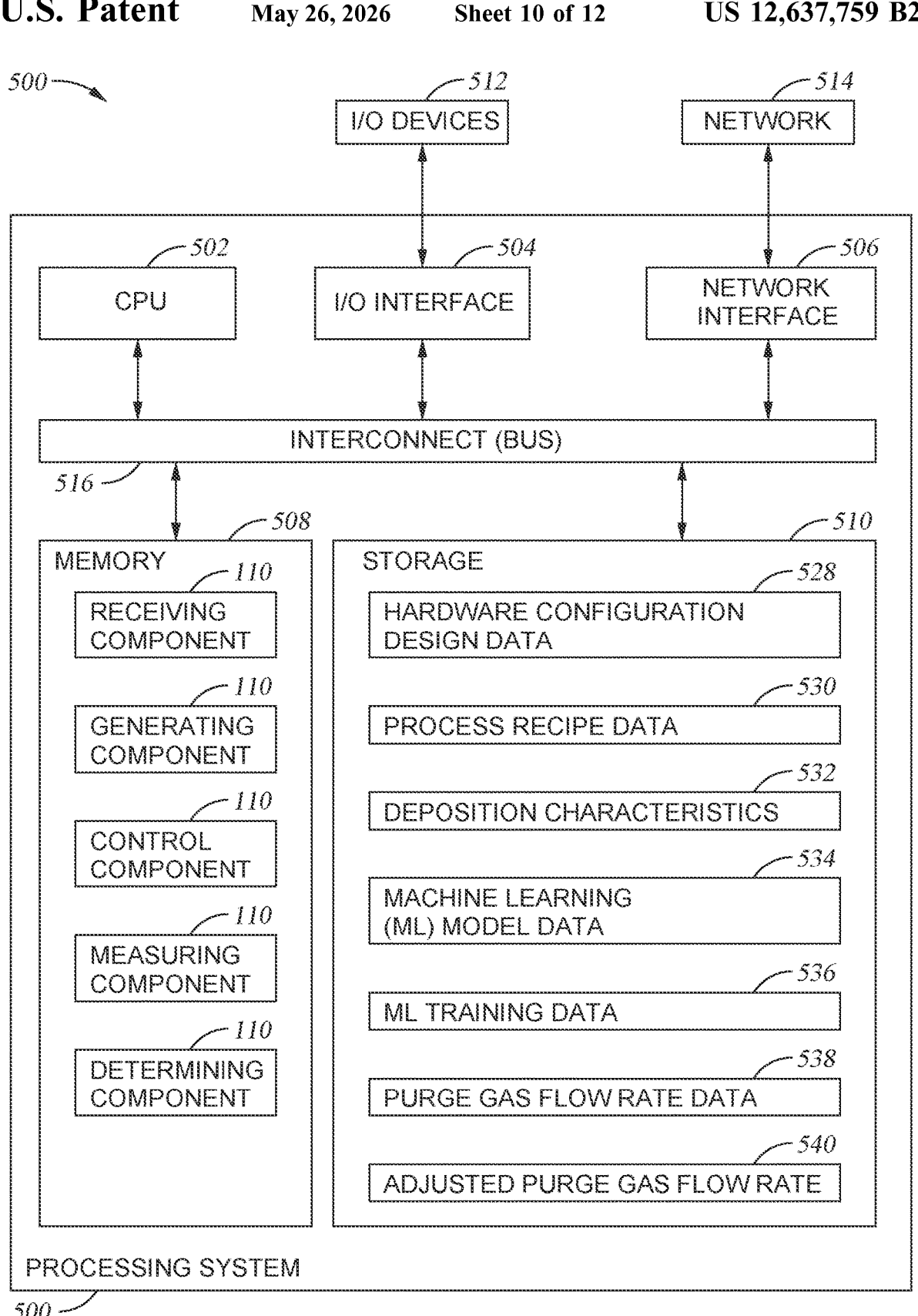
FIG. 5 is a processing system, according to embodiments of the present disclosure.

FIG. 5 depicts a processing system 500, according to some embodiments of the present disclosure. Processing system 500 is an example of controller 120, according to certain embodiments, and may be used in place of controller 120 described above. FIG. 5 depicts an example processing system 500 that may operate embodiments systems described herein to perform embodiments according to the flow diagrams and methods described herein. Processing system 500 includes a central processing unit (CPU) 502 connected to a data bus 516. CPU 502 is configured to process computer-executable instructions, e.g., stored in memory 508 or storage 510, and to cause the processing system 500 to perform embodiments of methods described herein on embodiments of systems described herein, for example with respect to FIGS. 1A-3E. CPU 502 is included to be representative of a single CPU, multiple CPUs, a single CPU having multiple processing cores, and other forms of processing architecture capable of executing computer-executable instructions.

Processing system 500 further includes input/output (I/O) device(s) 512 and interfaces 504, which allows processing system 500 to interface with input/output devices 512, such as, for example, keyboards, displays, mouse devices, pen input, and other devices that allow for interaction with the processing system 500. Note that the processing system 500 may connect with external I/O devices through physical and wireless connections (e.g., an external display device).

Processing system 500 further includes a network 514 interface, which provides processing system with access to external network 514 and thereby external computing devices. Processing system 500 further includes memory 508, which in this example includes a receiving component 518, generating component 520, control component 522, measuring component 524, and determining component 526 for performing operations described herein. Note that while shown as a single memory 508 in FIG. 5 for simplicity, the various aspects stored in memory 508 may be stored in different physical memories, including memories remote from processing system 500, but all accessible by CPU 502 via internal data connections such as data bus 516.

Storage 510 further includes hardware configuration design data 528, process recipe data 530, deposition characteristic data 532, machine learning (ML) model data 534, ML training data 536, purge gas flow rate data 538, and adjusted purge gas flow rate data 540, for performing operations described herein. As would be appreciated by one of ordinary skill, other data and aspects may be included in storage 510. As with memory 508, a single storage 510 is depicted in FIG. 5 for simplicity, but various aspects stored in storage 510 may be stored in different physical storages, but all accessible to CPU 502 via internal data connections, such as data bus 516, or external connection, such as network interfaces 506. One of ordinary skill in the art will appreciate that one or more elements of processing system 500 may be located remotely and accessed via a network 514.

Figure 6:
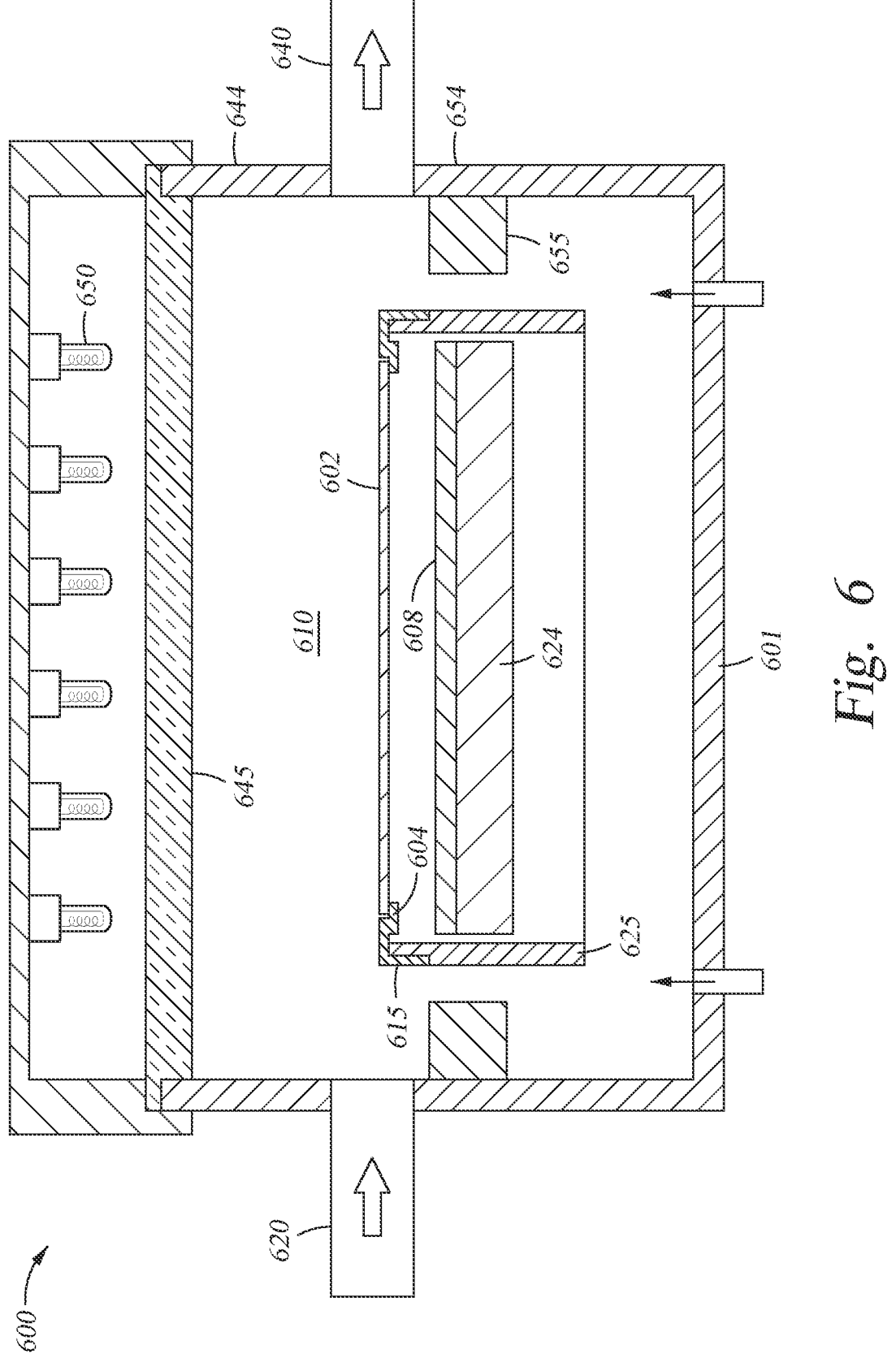
FIG. 6 is a schematic cross-sectional view of another process chamber that may be used to practice various embodiments of the disclosure.

FIG. 6 is a schematic cross-sectional view of another process chamber 600 that may be used in some embodiments. The process chamber 600 may be an RTP chamber. In some embodiments, the process chamber 600 is set up in a cross-flow configuration, as shown in FIG. 6, whereby an outlet 640 is 180 degrees from an inlet 620. A plurality of lamps 650 are situated above a transparent upper window 645 which is coupled to an upper body 644 of the process chamber 600. In some embodiments, the upper body is formed of an opaque material (e.g. aluminum or steel). A substrate 602 is situated on an annular substrate support 604 above a chill plate 624 in a process volume 610 of the process chamber 600. The annular substrate support is situated on an edge ring 615 which is situated on a support cylinder 625. The support cylinder 625 is configured to rotate the annular substrate support 604. In some embodiments, a purge gas may flow from a floor 601 of the process chamber 600. A plurality of reflectors 608 are coupled to a substrate side of the chill plate 624. In some embodiments, a stationary member 655 is coupled to a lower body 654 of the process chamber 600. The stationary member 655 may be an annular member.

Figure 7:
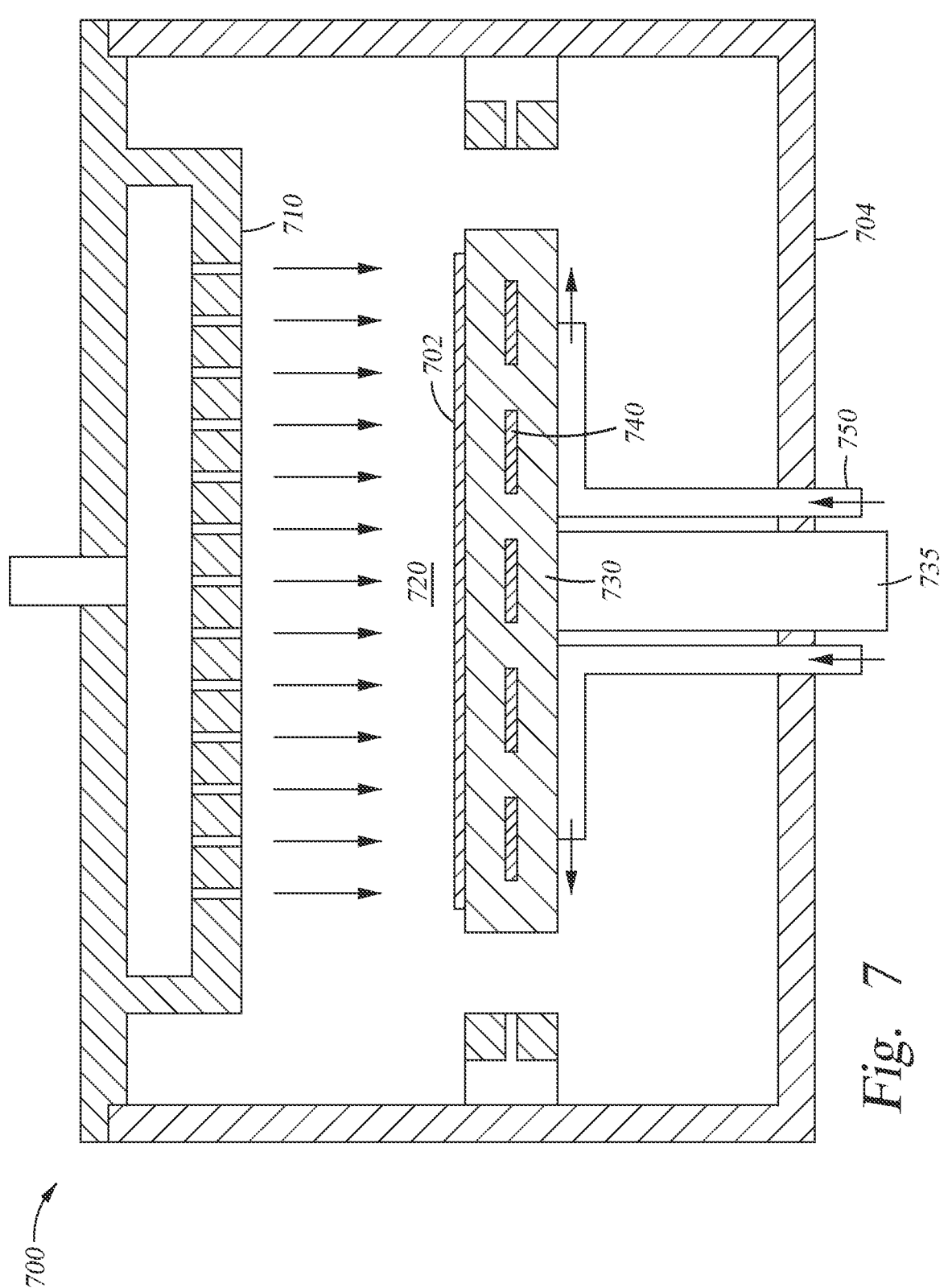
FIG. 7 is a schematic cross-sectional view of yet another process chamber that may be used to practice various embodiments of the disclosure.

FIG. 7 is a schematic cross-sectional view of yet another process chamber 700 that may be used in some embodiments. The process chamber 700 includes a showerhead 710 situated inside a process volume 720 of the process chamber 700. A substrate support pedestal 730 is configured to support a substrate 702 during processing. In some embodiments, an induced heater coil 740 is housed within the substrate support pedestal 730. An annular purge gas inlet 750 radially surrounds a substrate support shaft 735 at a floor 704 of the process chamber 700. The substrate support shaft 735 is configured to support the substrate support pedestal 730. In some embodiments, the substrate support shaft 735 is configured to rotate the substrate support pedestal and/or a substrate. In some embodiments, purge gas from the purge gas inlet 750 may exhaust 360 degrees throughout the process chamber 700 via exhaust vents.

It is contemplated that the methods described above can be integrated into a ML platform whereby the first input corresponding to the first hardware configuration, the second input corresponding to the first process recipe, and one or more measured deposition characteristics may be used in order to adjust the purge gas flow rate entering the chamber. As aforementioned, if the purge gas flow rate is excessively large, then overall precursor gas or process gas concentration over the substrate will be reduced due to dilution. In turn, the growth rate of the semiconductor material will be negatively impacted (e.g., lessened) and excess purge gas will be wasted, negatively effecting the process. Alternatively, if the purge gas flow rate is excessively low, then the process gas or precursor gas can get into places which are hard to clean and deposit an undesirable layer on components of the process chamber other than the substrate.

Aspects of the present disclosure contemplate the use of a digital duplicate of a physical processing chamber, such as those described herein. The digital duplicate is a digital simulation, stored in memory, of a corresponding physical process chamber. The digital duplicate reflects physical characteristics, such as physical dimensions, materials, and the like, of the actual physical chamber. The digital duplicate facilitates predictions of operations within the physical chamber. One or more rules, algorithms, physics models, fluid flow models, or the like, are used to simulate operations of the physical chamber using the digital duplicate. The digital duplicate may predict data, such as a deposition characteristic within the physical chamber, based upon a mathematical and physical comprehension of the process conditions input into the algorithms of the digital duplicate . For example, the digital duplicate may predict a deposition characteristic of the backside of the substrate (within the physical chamber) based upon a value of the process gas flow rate and purge gas flow rate into the physical chamber. In some embodiments, the digital duplicate will create multiple, distinct predicted metrology outputs. For example, the digital duplicate receives data indicative of the fluid flow rates (e.g., purge gas flow rate and process gas flow rate) of the physical chamber and mathematically computes more than a single solution, or output metrology data. The digital duplicate process chamber may automatically eliminate predicted output metrology data which is outside of an allowable range or otherwise violates rules of the software of the digital duplicate. In some embodiments, the digital duplicate processing chamber works in conjunction with a machine-learning model. This configuration is known as a physics informed machine learning model (PIMLM) or a physics informed neural network (PINN).

The machine learning model can be utilized to update the algorithms, rules, or other results output by digital duplicate, to refine and/or increase the accuracy of the digital duplicate simulations. Moreover, the machine learning model may additionally or alternatively recommend hardware configurations and/or process conditions to achieve desired results within the physical chamber. The machine learning model may operate in conjunction with the digital duplicate to provide improved processing within the physical chamber. For example, the machine learning model, in conjunction with the digital duplicate, may provide output to achieve a desired process condition (e.g., deposition characteristic) upon change of hardware configuration, a process recipe, or the like. Other beneficial effects are also contemplated.

The preceding description is provided to enable any person skilled in the art to practice the various embodiments described herein. The examples discussed herein are not limiting of the scope, applicability, or embodiments set forth in the claims. Various modifications to these embodiments will be readily apparent to those skilled in the art, and the generic principles defined herein may be applied to other embodiments. For example, changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

The methods disclosed herein comprise one or more operations or actions for achieving the methods. The method operations and/or actions may be interchanged with one another without departing from the scope of the claims. In other words, unless a specific order of operations or actions is specified, the order and/or use of specific operations and/or actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

While the foregoing is directed to embodiments of the present disclosure, other and further embodiments of the disclosure may be devised without departing from the basic scope thereof, and the scope thereof is determined by the claims that follow.

What is claimed is:

1. A method for optimizing purge gas flow during processing of a semiconductor substrate in a process chamber, comprising:

positioning a substrate on a surface of a substrate support within the process chamber, the process chamber comprising an upper window and a lower window opposite the upper window, the substrate support in between the upper window and the lower window, and one or more sensors positioned outside the lower window such that the one or more sensors have a direct line of sight to the lower window, a backside of the substrate support, or both the lower window and the backside of the substrate support;

receiving, by a controller operatively coupled to the process chamber, a first input corresponding to a first process recipe of a deposition process to be performed in the process chamber;

receiving, by the controller, a second input corresponding to a first hardware configuration of the process chamber;

determining, by the controller and based on the first input and the second input, a first purge gas flow rate for the process chamber, the determining the first purge gas flow rate comprising:

utilizing a machine learning model comprising a digital twin model of the process chamber to simulate fluid dynamics within the process chamber based on the first process recipe and the first hardware configuration, and to predict a first deposition characteristic of at least one of the backside of the substrate support and the lower window in the process chamber;

performing, by the controller, a first deposition process to deposit material on the substrate positioned on the surface of the substrate support in the process chamber using the first process recipe at the first purge gas flow rate in the process chamber, wherein the substrate support protects a bottom surface of the substrate from unwanted deposition;

measuring, by the one or more sensors, a measured deposition characteristic of at least one of the backside of the substrate support and the lower window in the process chamber;

determining, by the controller utilizing the machine learning model and based on the first input, the second input, and a difference between the predicted first deposition characteristic and the measured deposition characteristic, a second purge gas flow rate, the second purge gas flow rate different from the first purge gas flow rate; and performing, by the controller, a second deposition process to deposit material on the substrate positioned on the surface of the substrate support in the process chamber using the first process recipe at the second purge gas flow rate.

2. The method of claim 1, wherein the method increases deposition uniformity on the substrate and reduces unwanted deposition on chamber components thereby improving throughput and reducing maintenance requirements.

3. The method of claim 1, wherein the one or more sensors comprises a pyrometer or an optical spectrometer or a camera, each positioned to measure the first deposition characteristic of at least one of the backside of the substrate support or the lower window in the process chamber.

4. The method of claim 3, further comprising one or more second sensors within the process chamber, each configured to provide real-time feedback on deposition characteristics at different chamber locations.

5. The method of claim 1, wherein the first hardware configuration comprises a non-vented or vented liner, a circular or elliptical preheating ring, and/or the substrate support overlapping the preheating ring.

6. The method of claim 1, wherein the digital twin model comprises a digital simulation of physical characteristics of the process chamber, the physical characteristics comprising the first hardware configuration of the process chamber.

7. The method of claim 1, wherein determining the first purge gas flow rate further comprises referencing a database of hardware configuration and process recipes based on user input.

8. The method of claim 1, wherein the first process recipe is updated to include the second purge gas flow rate, thereby enabling adaptive process control.

9. The method of claim 6, wherein the second purge gas flow rate or a difference between the first purge gas flow rate and the second purge gas flow rate is displayed for an operator.

10. The method of claim 1, wherein the measured deposition characteristic comprises a thickness, a mass fraction, a transmissivity, a transparency, an emissivity, or any combination thereof.

11. The method of claim 1, wherein the controller automatically adjusts the purge gas flow rate in real time from the first purge gas flow rate to the second purge gas flow rate in response to feedback from the one or more sensors.

12. The method of claim 1, wherein measuring the first deposition characteristic of the process chamber via the one or more sensors occurs more than once throughout the first deposition process, enabling real-time adjustment of the purge gas flow rate.

13. The method of claim 1, wherein a purge gas of the first purge gas flow rate is a flow module purge gas, a slit purge gas, a rotational purge gas, or a liner purge gas.

14. A method for optimizing purge gas flow during processing of a semiconductor substrate in a process chamber, comprising:

positioning a substrate on a surface of a substrate support within the process chamber, the process chamber comprising an upper window and a lower window opposite the upper window, the substrate support in between the upper window and the lower window, and one or more sensors positioned outside the lower window such that the one or more sensors have a direct line of sight to the lower window, a backside of the substrate support, or both the lower window and the backside of the substrate support;

receiving, by a controller operatively coupled to the process chamber, a first input corresponding to a first process recipe of a deposition process to be performed in the process chamber;

receiving, by the controller, a second input corresponding to a first hardware configuration of the process chamber;

determining, by the controller and based on the first input and the second input a first purge gas flow rate for the process chamber, the determining the first purge gas flow rate comprising:

utilizing a machine learning model comprising a digital twin model of the process chamber to simulate fluid dynamics within the process chamber based on the first process recipe and the first hardware configuration, and to predict a first deposition characteristic of at least one of the backside of the substrate support and the lower window in the process chamber;

performing, by the controller, a first deposition process to deposit material on the substrate positioned on the surface of the substrate support in the process chamber using the first process recipe at the first purge gas flow rate in the process chamber, wherein the substrate support protects a bottom surface of the substrate from unwanted deposition;

measuring, by the one or more sensors, a measured deposition characteristic of at least one of the backside of the substrate support and the lower window in the process chamber during the first deposition process;

determining, by the controller utilizing the machine learning model and based on the first input, the second input, and the measured deposition characteristic, a second purge gas flow rate, the second purge gas flow rate different from the first purge gas flow rate;

performing, by the controller, a second deposition process to deposit a material on the substrate positioned on the surface of the substrate support in the process chamber using the first process recipe at the second purge gas flow rate in the process chamber;

measuring, by the one or more sensors, the measured deposition characteristic of at least one of the backside of the substrate support and the lower window in the process chamber during the second deposition process;

determining, by the controller utilizing the machine learning model, based on a change in the measured deposition characteristic of the second deposition process, a third purge gas flow rate, the third purge gas flow rate different from the second purge gas flow rate; and performing, by the controller, a third deposition process to deposit a material on the substrate positioned on the surface of the substrate support in the process chamber using the first process recipe at the third purge gas flow rate in the process chamber.

15. The method of claim 14, wherein the measured deposition characteristic includes a thickness of a film.

16. The method of claim 14, wherein the controller automatically adjusts the purge gas flow rate in real time from the first purge gas flow rate to the second purge gas flow rate in response to feedback from the one or more sensors.

17. The method of claim 1, wherein the first deposition process comprises co-flowing a precursor gas and a first purge gas, the first purge gas flowing at the first purge gas flow rate and the precursor gas comprises at least one of dichlorosilane (DCS) and trichlorosilane (TCS).

18. The method of claim 1, wherein the first deposition process comprises co-flowing a precursor gas and a first purge gas at the first purge gas flow rate, the precursor gas comprises disilane (DS).

19. The method of claim 14, wherein the first deposition process comprises co-flowing a precursor gas and a first purge gas, the first purge gas flowing at the first purge gas flow rate and the precursor gas comprises at least one of dichlorosilane (DCS) and trichlorosilane (TCS).

20. The method of claim 14, wherein the first deposition process comprises co-flowing a precursor gas and a first purge gas at the first purge gas flow rate, the precursor gas comprises disilane (DS).

* * * * *